United States Patent [19]
Saito

[11] Patent No.: US 6,541,388 B1
[45] Date of Patent: Apr. 1, 2003

(54) PLASMA ETCHING TERMINATION DETECTING METHOD

(75) Inventor: Susumu Saito, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 23 days.

(21) Appl. No.: 09/661,446

(22) Filed: Sep. 13, 2000

(30) Foreign Application Priority Data

Sep. 14, 1999 (JP) .......................................... 11-261105

(51) Int. Cl.[7] .............................................. H01L 21/302
(52) U.S. Cl. ...................... 438/712; 438/714; 438/719
(58) Field of Search ........................... 438/14, 15, 16, 438/712, 714, 719; 216/59, 60, 61

(56) References Cited

U.S. PATENT DOCUMENTS

| 3,824,017 A | * | 7/1974 | Galyon | 356/108 |
| 4,317,698 A | * | 3/1982 | Christol et al. | 156/626 |
| 4,618,262 A | * | 10/1986 | Maydan et al. | 356/357 |
| 4,707,611 A | * | 11/1987 | Southwell | 250/560 |
| 4,909,631 A | * | 3/1990 | Tan et al. | 356/381 |
| 5,405,488 A | * | 4/1995 | Dimitrelis et al. | 156/627 |
| 5,658,418 A | | 8/1997 | Coronel et al. | |
| 6,081,334 A | * | 6/2000 | Grimbergen et al. | 356/357 |

FOREIGN PATENT DOCUMENTS

| JP | 61-152017 | * | 7/1986 | ......... H01L/21/302 |
| JP | 10-64884 | | 3/1998 | |

* cited by examiner

Primary Examiner—Robert Kunemund
Assistant Examiner—Duy-Vu Deo
(74) Attorney, Agent, or Firm—Oblon, Spivak, McClelland, Maier & Neustadt, P.C.

(57) ABSTRACT

A method detects an etching termination time point at which a to-be-processed layer formed on an underlayer is etched using plasma. Two types of light components of different wavelengths are applied to the to-be-processed layer, during plasma etching, thereby causing light to reflect from the surface of the to-be-processed layer and from a boundary between the to-be-processed layer and the underlayer, those waveforms of two reflected light components of different wavelengths and included in the reflected light, which result from interference, are detected. An approximate etching termination time point is detected on the basis of a phase difference between the detected waveforms.

9 Claims, 4 Drawing Sheets

PLASMA ETCHING TERMINATION DETECTING METHOD

CROSS-REFERENCE TO RELATED APPLICATIONS

This application is based upon and claims the benefit of priority from the prior Japanese Patent Application No. 11-261105, filed Sep. 14, 1999, the entire contents of which are incorporated herein by reference.

BACKGROUND OF THE INVENTION

This invention relates to a method for detecting the termination time point of plasma etching executed on a to-be-processed object.

An etching method using plasma is widely employed in a semiconductor manufacturing process and an LCD substrate manufacturing process. As a typical etching method, it is known to place a to-be-processed object, such as a semiconductor wafer, on a lower electrode located parallel to an upper electrode, then to apply a high frequency voltage between the electrodes, thereby discharging electricity, creating plasma of an etching gas between the electrodes and etching the object in accordance with a predetermined pattern.

In this etching method, in order to execute accurate etching, it is necessary to precisely detect an etching termination time point at which etching must be ceased. An etching termination detecting method using emission spectroscopic analysis, for example, is widely used as an etching termination detecting method. In this termination detecting method, a predetermined activated species that can be observed most easily is selected from activated species such as radicals, ions, etc. of a decomposed product or a reaction-formed product of an etching gas, and an etching termination time point is detected on the basis of variations in the intensity of emission with a predetermined wavelength due to the selected activated species. For example, when etching a silicon oxide film using a CF-based etching gas such as $CF_4$, light of a predetermined wavelength (e.g. 483.5 nm) emitted from $CO^*$ as a reaction-formed product is detected, and the etching termination time point is determined on the basis of a changed point of the detected intensity. Alternatively, when etching a silicon nitride film using a CF-based etching gas such as $CF_4$, light of a predetermined wavelength (e.g. 674 nm) emitted from $N^*$ as a reaction-formed product may be detected and used to detect the etching termination. Thus, in the conventional termination detecting method, light of different wavelengths is used in different etching processes.

However, in the conventional termination detecting method using emission spectroscopic analysis, the point in time is determined to be the end of etching, at which the etching of an object finishes and its underlayer is exposed, and therefore the intensity of light of a predetermined wavelength changes. Accordingly, over-etching is inevitable, with the result that the underlayer is also etched and damaged. These days, the problem of over-etching the underlayer significantly influences semiconductor products and may cause defective products, since semiconductor products are being more and more highly integrated, and accordingly, each layer including the underlayer, which constitutes the products, is made more and more thin. For example, when selectively etching a polysilicon layer as a to-be-processed layer to form a gate electrode on a gate oxide film as the underlayer of a polysilicon layer, the gate oxide film is more greatly damaged than the polysilicon layer since the former is much thinner than the latter.

BRIEF SUMMARY OF THE INVENTION

It is an object of the invention to provide a method for detecting the end of etching of a to-be-processed layer without over-etching and damaging the underlayer of the to-be-processed layer.

It is another object of the invention to provide a method for detecting the end of etching of a to-be-processed layer included in a semiconductor device, without over-etching and damaging the underlayer of the to-be-processed layer, even if the semiconductor device has a multi-layer structure and hence the underlayer is very thin.

According to a first aspect of the invention, there is provided a method of detecting an etching termination time point at which a to-be-processed layer formed on an underlayer is etched using plasma, comprising:

applying, to the to-be-processed layer, at least two types of light components of different wavelengths during plasma etching, thereby causing light to reflect from the surface of the to-be-processed layer and from a boundary between the to-be-processed layer and the underlayer;

detecting those waveforms of at least two reflected light components of different wavelengths and included in the reflected light, which result from interference; and detecting an approximate etching termination time point on the basis of a phase difference between the detected waveforms.

According to a second aspect of the invention, there is provided an etching termination time point detecting method comprising:

applying, to a to-be-processed dummy layer, light having a plurality of wavelengths, thereby causing light to reflect from the surface of the to-be-processed dummy layer and from a boundary between the to-be-processed dummy layer and an underlayer;

detecting those waveforms of at least two reflected light components of different wavelengths and included in the reflected light, which result from interference;

detecting, as an approximate etching termination time point, a time point at which a phase difference between the detected waveforms becomes 0;

setting a threshold value for detecting the approximate etching termination time point;

applying the light having the plurality of wavelengths to a to-be-processed layer included in a to-be-processed object, thereby causing light to reflect from the surface of the to-be-processed layer and from the boundary between the to-be-processed layer and an underlayer;

detecting those waveforms of at least two reflected light components of different wavelengths and included in the reflected light from the to-be-processed layer, which result from interference; and sequentially calculating a phase difference between the detected waveforms, then comparing the calculation result with the threshold value, and determining the approximate etching termination time point of the to-be-processed object.

According to a third aspect of the invention, there is provided an etching termination time point detecting method comprising:

etching, using plasma, a to-be-processed layer on an underlayer in a low selective ratio mode in which a ratio of a rate of etching the to-be-processed layer to a rate of etching the underlayer is low;

applying, to the to-be-processed layer, at least two types of light components of different wavelengths during plasma etching, thereby causing light to reflect from the surface of the to-be-processed layer and from a boundary between the to-be-processed layer and the underlayer;

detecting those waveforms of at least two reflected light components of different wavelengths and included in the reflected light, which result from interference;

detecting an approximate etching termination time point on the basis of a phase difference between the detected waveforms; and switching, upon detecting the approximate etching termination time point, the low selective ratio mode to a high selective ratio mode, thereby etching a remaining portion of the to-be-processed layer for a predetermined time period.

In the above methods, it is preferable that the phase difference is obtained from an intensity ratio between the detected waveforms or a differentiation value of the intensity ratio. The underlayer and the to-be-processed layer can be formed of a gate oxide film and a polysilicon layer for a gate electrode, respectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Etching termination detecting methods according to embodiments of the invention will be described with reference to FIGS. 1 to 7.

Figure 1:
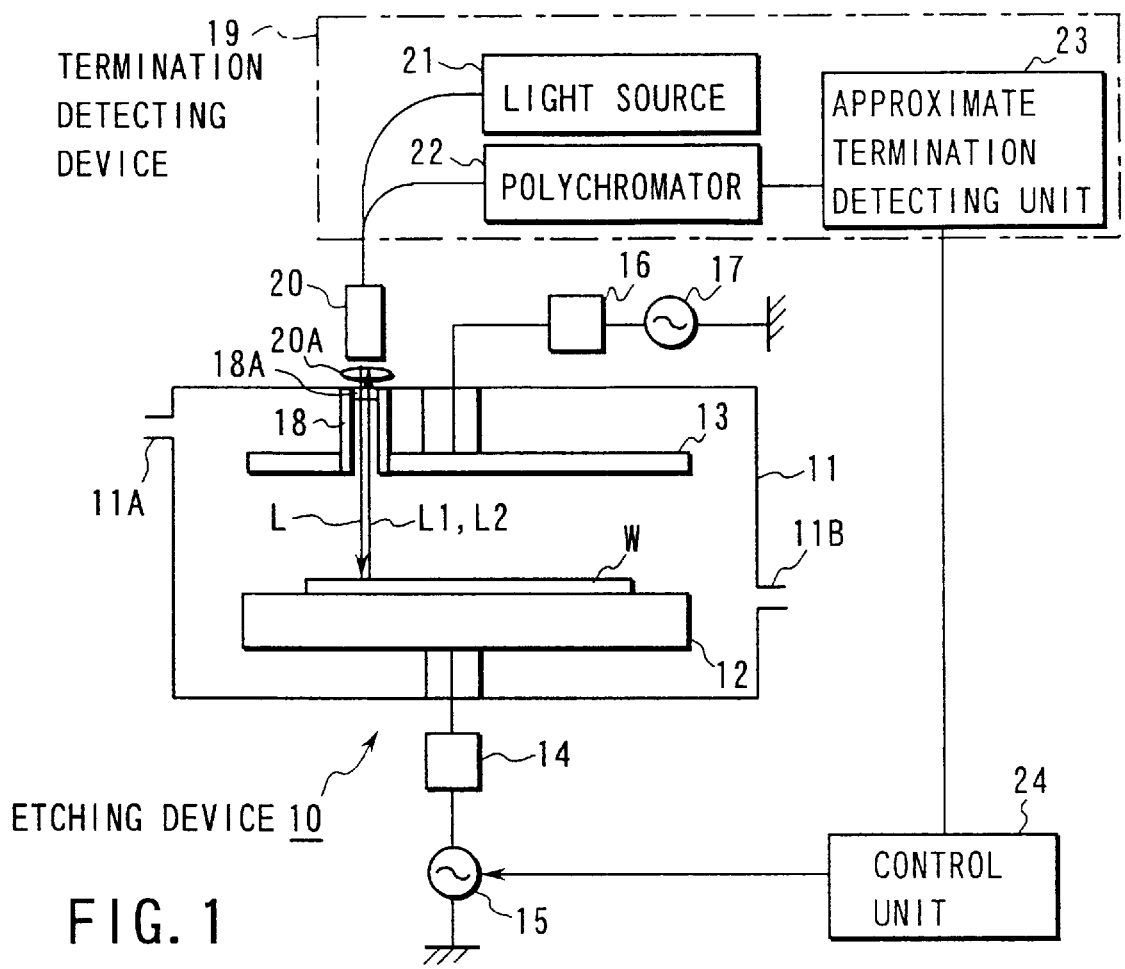
FIG. 1 is a schematic view illustrating an example of an etching device to which an etching termination detecting method according to the invention is applied.

Referring first to FIG. 1, a description will be given of an example of an etching device to which the etching termination detecting methods of the invention are applicable. An etching device 10 shown in FIG. 1 comprises a process chamber 11 made of a conductive material such as aluminum, a lower electrode 12 located on the bottom surface of the process chamber 11 and also serving as a susceptor for mounting thereon a semiconductor wafer W, and an upper electrode 13 located above the lower electrode 12 with a predetermined distance therefrom. A gas supply section 11A connected to a gas source (not shown) is formed in an upper portion of the peripheral wall of the process chamber 11, while a gas exhaust section 11B connected to a vacuum exhausting unit (not shown) is formed in a lower portion of the peripheral wall of the process chamber 11. The lower electrode 12 is connected via a matching box 14 to a high frequency power supply 15 for supplying thereto a high frequency current. The upper electrode 13 is connected via a matching box 16 to a high frequency power supply 17 for supplying thereto a high frequency current having a higher frequency than the first-mentioned high frequency current.

Figure 2:
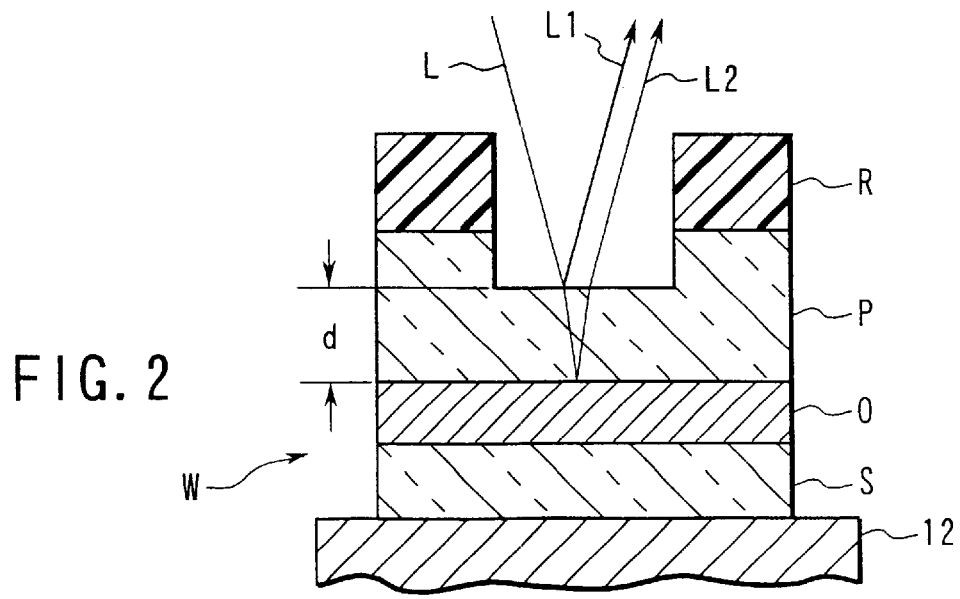
FIG. 2 is a view useful in explaining interference light used for detecting the end of etching of a polysilicon layer.

When executing etching in the above-described apparatus, at first, the process chamber 11 is exhausted to a predetermined vacuum level by exhausting a gas therefrom through the gas exhaust section 11B via the vacuum exhausting unit. Subsequently, an etching gas is supplied to the process chamber 11 through the gas supply section 11A with a high frequency power applied between the upper and lower electrodes 12 and 13, thereby creating plasma of the etching gas between the electrodes 12 and 13. As a result, for example, as shown in FIG. 2, a polysilicon layer P (thickness: 0.2 $\mu$m) is etched, at a width of 0.6–3.0 $\mu$m, from the opening of a resist layer R (thickness: 1.1 $\mu$m), as the top layer of the wafer W, to a gate oxide film O (thickness: 0.1 $\mu$m) formed of a silicon oxide film, which are provided on the lower electrode 12 (for facilitating the description, FIG. 2 shows a state in which the polysilicon layer is not completely etched). A gate electrode of a predetermined pattern is thus formed. The wafer W as a to-be-processed object indicates an assembly of a semiconductor substrate S, the gate oxide film O formed thereon and the polysilicon layer P formed on the film O.

In the step of etching the polysilicon layer P, anisotropic etching is executed at high speed. At this stage, etching is executed in a low selective ratio mode in which the ratio of the rate of etching the polysilicon layer P to the rate of etching the gate oxide film O as an underlayer is low. At a later stage after an approximate etching termination time point is detected by an etching termination detecting device described later, the polysilicon layer P is etched in a high selective ratio mode in which the ratio of etching speed of the polysilicon layer P to the gate oxide film O as an underlayer is high. When the gate oxide film O is etched in the high selective ratio mode, it is little etched even if the polysilicon layer P is over-etched. Thus, the gate oxide film O is protected from etching. Accordingly, where the etching termination time point varies between different portions of a wafer W, etching of the gate oxide film O is prevented even at the portion of the wafer at which the etching termination time point is earlier than the other portions. The low selective ratio mode can be switched to the high selective ratio mode by changing the etching gas from one to another, and/or its flow rate, or by controlling the high frequency power applied to the lower electrode 12.

A cylindrical window member 18 for monitoring is mounted on the upper wall of the process chamber 11 such that the lower end of the member 18 extends through the upper electrode 13. A monitoring window 18A made of a transparent material such as quartz is fitted in an upper end portion of the window member 18. An etching termination detecting device 19 is provided outside the process chamber 11. An optical fiber 20 is provided between the device 19 and the monitoring window 18A. Further, a condenser 20A is provided between one end of the optical fiber 20 and the window 18A such that it has an optical path connected to that of the optical fiber 20. The other end of the optical fiber 20 is divided into two portions—one connected to a light source 21 for the etching termination detecting device 19, and the other connected to a polychromator 22. The etching termination detecting device 19 includes an approximate termination calculating unit 23 electrically connected to the polychromator 22. The unit 23 is connected to a control unit 24. The light source 21 may be constituted of a light source capable of emitting light of a plurality of wavelengths, such as a xenon lamp, a tungsten lamp, LED, etc.

A method for detecting an etching termination time point according to an embodiment of the invention will now be described. As is shown in FIGS. 1 and 2, white light L is perpendicularly applied from the light source 21 constituted of, for example, a xenon lamp to the surface of the wafer W via the optical fiber 20 (in FIG. 2, the white light L is slightly inclined to facilitate the explanation). As a result, part of the white light L reflects as reflected light L1 from the top surface of the polysilicon layer P, while the remaining part of the white light L passes through the polysilicon layer P and reflects as reflected light L2 from the boundary of the polysilicon layer P and the gate oxide film O. These reflected light components L1 and L2 become interference light, and are guided through the monitoring window member 18 and the optical fiber 20 to the polychromator 22. The polychromator 22 detects the interference light and subjects it to spectroscopic analysis, thereby selecting two interference light components of different wavelengths. These two interference light components are subjected to photoelectric conversion and supplied to the approximate termination calculating unit 23. The unit 23 detects an approximate etching termination time point based on the phase difference between the two interference light components, and switches the etching mode from the low selective ratio mode to the high selective ratio mode via the control unit 24, thereby executing etching for a preset time period to remove the remaining polysilicon layer. Since the preset time period is very short, over-etching meaning that even the gate oxide film O as the underlayer is etched is almost avoided. At this time, the approximate termination time point is determined when the phase difference between the two interference light components is lower than a preset threshold value. Thus, while the interference light components are monitored, the polysilicon layer P has its thickness (hereinafter referred to as a "remaining thickness") d gradually thinned by etching. The intensity I of the interference light varies as the remaining thickness d reduces.

The relationship between the remaining thickness d and the interference light will be described. There is an optical path difference (2d) between the light reflected from the top surface of the polysilicon layer P and the light reflected from the boundary of the polysilicon layer P and the gate oxide film O. In the case of substantially vertical radiation, the optical path difference causes a phase difference between the two reflected light components, which generates interference light. If the phase difference is integral multiples of the wavelength of light reflected from the polysilicon layer, i.e. if $2d=m\lambda_1$, the intensity of the interference light is minimum. On the other hand, if the phase difference is deviated from it by half the wavelength, i.e. if $2d=m\lambda_1+\lambda_1/2$, the intensity of the interference light is maximum. Here, $\lambda_1$ represents the wavelength of light reflected from the polysilicon layer, and m a voluntarily selected integer. Further, supposing that the wavelength of incident light is $\lambda_0$, and the refractive index of the polysilicon layer P is n, the relationship of $\lambda_1=\lambda_0/n$ is established. From this, the remaining thickness d at which the interference light is minimum, and the remaining thickness d at which the interference light is maximum are given by the following equations (1) and (2), respectively. Accordingly, as the remaining thickness d decreases, it alternately satisfies the following equations (1) and (2), and therefore the intensity of the interference light varies such that it periodically repeats its maximum and minimum values as the remaining thickness d decreases.

$$d=(m\lambda_0/2n) \tag{1}$$

$$d=m\lambda_0/2n+\lambda_0/4n \tag{2}$$

The intensity I of the interference light with respect to the remaining thickness d is expressed by the following equation (3):

$$I=I_1+I_2-2\sqrt{I_1 I_2}\cos(2\pi\times 2nd/\lambda) \tag{3}$$

where $I_1$ represents the intensity of light reflected from the top surface of the polysilicon layer P, and $I_2$ the intensity of light reflected from the boundary of the polysilicon layer P and the gate oxide film O.

As is evident from the equation (3), the intensity I of the interference light repeats periodical variations as the remaining thickness d decreases, and finally assumes a predetermined value at the etching termination time point at which the polysilicon layer P disappears.

Figure 3:
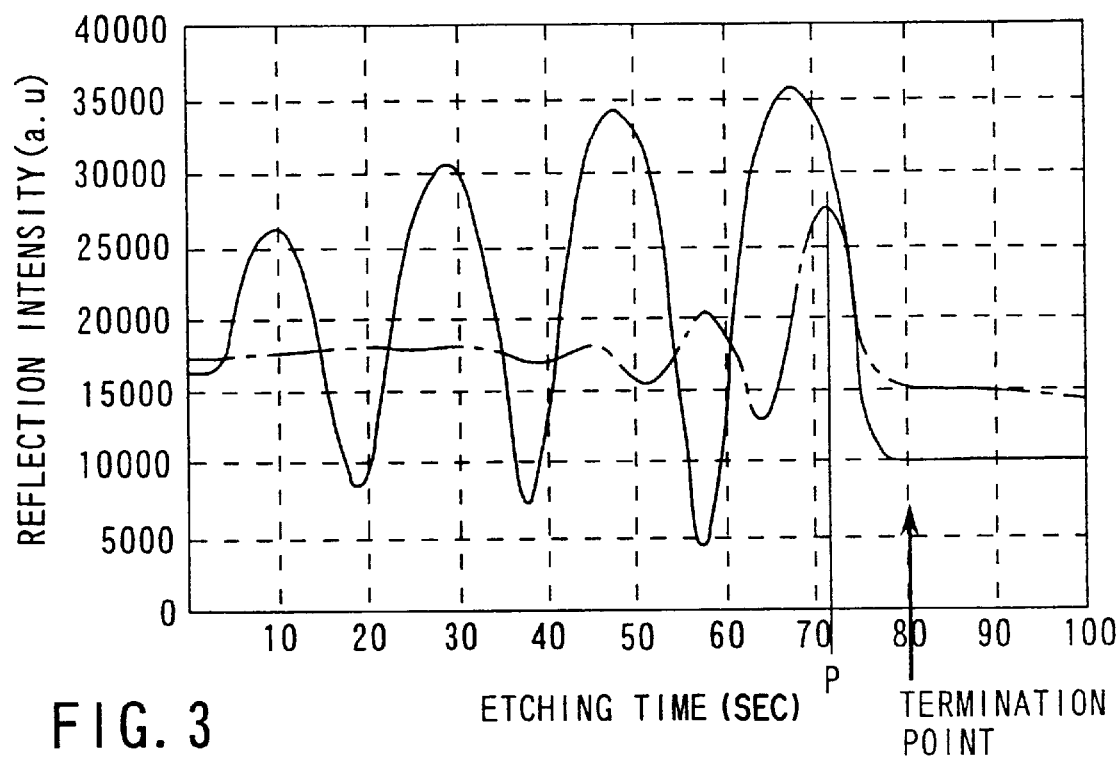
FIG. 3 is a graph illustrating the relationship between the etching period of a polysilicon layer and the waveforms of two types of reflected light resulting from interference.
Figure 4:
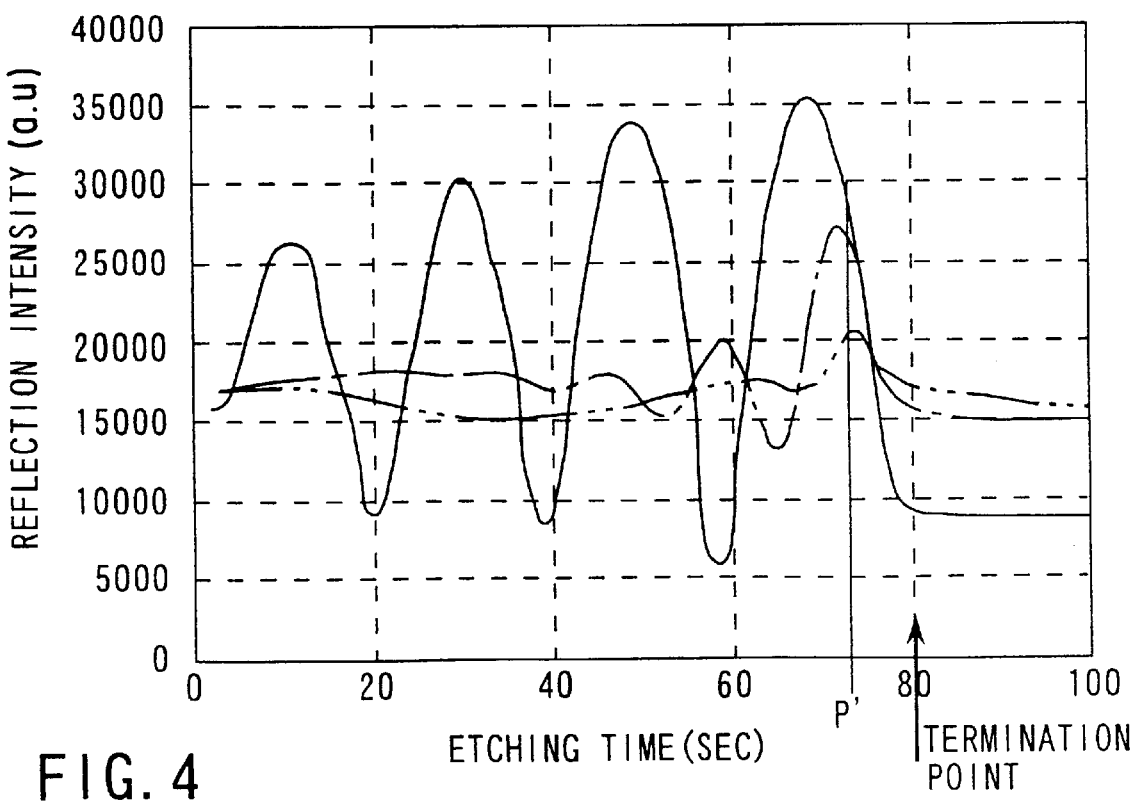
FIG. 4 is a graph illustrating the relationship between the etching period of a polysilicon layer and the waveforms of three types of reflected light resulting from interference.

Since the polysilicon layer P has a low light transmissivity, light interference will not easily occur when the layer P is thick. However, as the thickness of the layer P decreases, transmission of light through the layer P becomes easier and the degree of light interference becomes higher. In other words, as the etching process advances, the intensity of the interference light gradually increases and periodically varies as shown in FIGS. 3 and 4 in accordance with the equation (3). In FIGS. 3 and 4, the abscissa indicates the etching period (seconds), the ordinate the reflection intensity (voluntarily selected values), the solid line the waveform, resulting from interference, of reflected light with a wavelength of 500 nm, and the one-dotted line the waveform, resulting from interference, of reflected light with a wavelength of 400 nm. Further, in FIG. 4, the double-dotted line indicates the waveform, resulting from interference, of reflected light with a wavelength of 350 nm. As is understood from FIGS. 3 and 4, light interference occurs during the entire etching period in the case of the reflected light with the wavelength of 500 nm, while it occurs from the middle stage of etching in the case of the reflected light with the wavelength of 400 nm. In the case of the reflected light with the wavelength of 350 nm, light interference occurs only at the last stage of etching. Thus, although the shorter the wavelength of light, the lower the possibility of occurrence of light interference, light interference absolutely occurs as the thickness of the polysilicon layer P decreases.

As is evident from FIGS. 3 and 4, when detecting the etching termination using only one reflected light component, it can be detected in a reliable manner since the time point at which the intensity of reflected light assumes a constant value is considered to be the etching termination time point. In the case of using a single reflected light component, however, the time point at which the etching of the polysilicon layer P is finished is considered as the termination time point, and therefore over-etching cannot be avoided. Japanese Patent Application KOKAI Publication No. 10-64884 proposes a similar termination detecting method that uses a single reflected light component.

On the other hand, in the preferred embodiment, as aforementioned, two appropriate reflected light components of different wavelengths are selected by the polychromator 22. On the basis of variations in the phase difference between those waveforms of the reflected light components, which result from interference, an approximate etching termination time point immediately before the actual etching termination time point is determined. The waveforms, resulting from interference, of the reflected light components of different wavelengths have respective cycles of variations in reflection intensity. The earlier the stage of etching, the greater the phase difference between the waveforms. The closer to the end of etching, the closer to zero the phase difference. At the end of etching, there is no light interference in each reflected light component and hence the reflected light components each show a constant reflection intensity.

Moreover, in the case of using two types of reflected light components, they show quite different waveforms with a great phase difference at the middle stage of etching as shown in FIGS. 3 and 4 since their waveforms have different cycles. However, as the process of etching approaches the final stage, the phase difference between the waveforms gradually decreases, and the waveforms are made to correspond to each other at the end of etching. At the middle stage of etching, the waveforms significantly differ from each other. Therefore, even if one of the waveforms assumes a value close to that assumed at the end of etching, the etching termination time point is not detected at this stage, since the other of the waveforms assumes a value quite different from the value assumed at the end of etching. On the other hand, when the process of etching approaches the final stage, the phase difference becomes very small. When the phase difference is small, it is determined that the process of etching approaches the final stage. If a threshold value T for detecting, as an approximate termination time point, a time point at which the phase difference between the waveforms reaches a predetermined low value, (P and P' in FIGS. 3 and 4) is set in the approximate termination detecting unit 23, the unit 23 sequentially calculates the phase difference during etching, compares the calculated phase difference t with the threshold value T, and detects an approximate termination time point when the calculated value t is lower than the threshold value T and this condition continues for a time period. Thus, the approximate termination detecting unit 23 automatically detects the approximate termination time point. The detection of the approximate termination time point by the approximate termination detecting unit 23 enables the termination of etching of the polysilicon layer P with a small amount of polysilicon layer P left. A time point at which an extremely small amount of polysilicon layer P is left is set as the termination time point so as to prevent over-etching to etch even the gate oxide film O. Preferably, a sample wafer is used to determine the approximate termination time point. The threshold value T of the approximate termination time point set using the sample wafer is used to etch wafers as commercial goods.

After the approximate termination detecting unit 23 detects the approximate termination time point as described above, the etching mode is shifted from the low selective ratio mode to the high selective ratio mode via the control unit 24 to remove the extremely small amount of remaining polysilicon layer P. Even if, at this time, the gate oxide film O as the underlayer appears, it is little damaged since the etching rate is extremely low with respect to it and a very short etching period is set.

As described above, in the embodiment, white light is applied to the polysilicon layer P of the wafer W, and those two of light components reflected from the top surface of the polysilicon layer P and the boundary of the polysilicon layer P and the gate oxide film O, which have wavelengths of, for example, 400 nm and 500 nm, are detected, thereby detecting an approximate etching termination time point immediately before the phase difference between the waveforms of the reflected light components reaches 0. Accordingly, the etching process can be stopped at the detected approximate termination time point while monitoring the polysilicon layer P that has its thickness reduced during etching.

Further, since, in the embodiment, the etching mode is switched from the low selective ratio mode to the high selective ratio mode after detecting the approximate termination time point, an extremely small amount of polysilicon layer P left after the etching process can be completely removed. Even if, at this time, over-etching occurs, the gate oxide film O is protected from over-etching, since the etching rate with respect to the gate oxide film O is very low.

Figure 5:
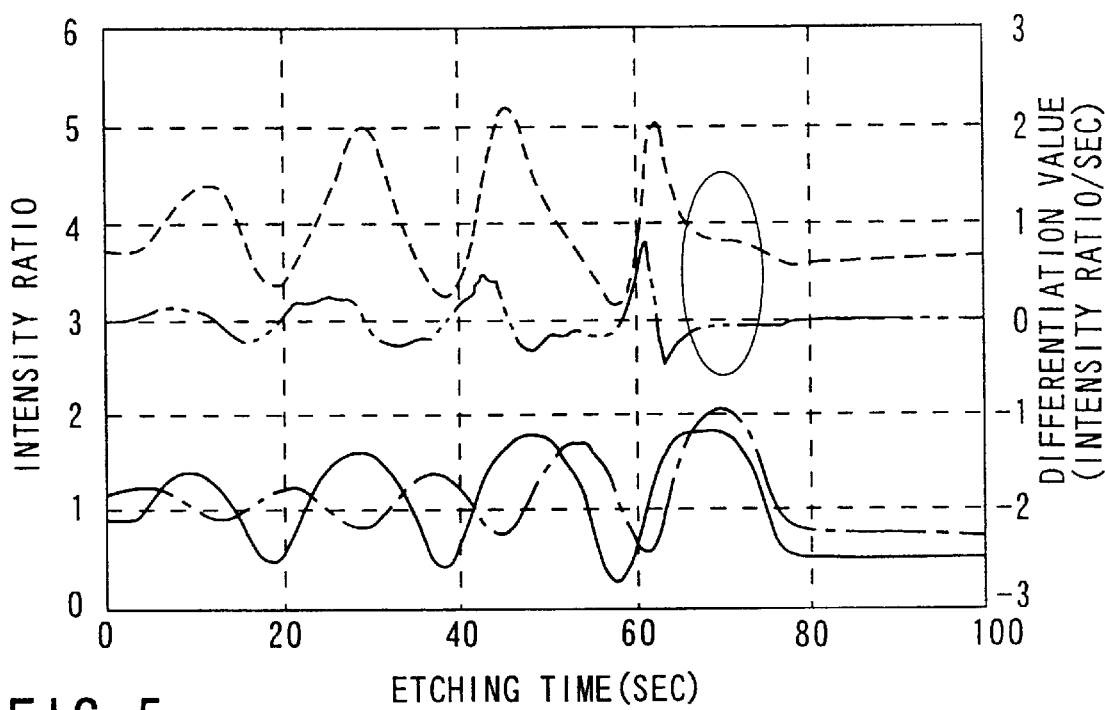
FIG. 5 is a graph illustrating the relationship between the etching period of a polysilicon layer and the waveforms resulting from interference, the intensity ratio and the differentiation value of the intensity ratio of the two types of reflected light.

FIG. 5 shows data for a method for detecting the phase difference between two types of interference light components having wavelengths of, for example, 450 nm (indicated by the one-dotted line in the figure) and 500 nm (indicated by the solid line in the figure), using the intensity ratio between the interference light components or the differentiation value of each intensity ratio. The two lines as shown are illustrated merely as a reference, and so do not directly relate to the idea of the present invention. The broken line of FIG. 5 indicates the relationship between the etching time period and the intensity ratio of the two types of interference light components or reflected light components. The two-dotted line of FIG. 5 indicates the differentiation values of the intensity ratios. When using the intensity ratio, the time point at which the intensity ratio approaches a constant value is set as the approximate termination time point. On the other hand, when using the differentiation value, the time point at which the differentiation value approaches 0 is set as the approximate termination time point. In FIG. 5, any time point included in the encircled portion can be set as the approximate termination time point.

Figure 6:
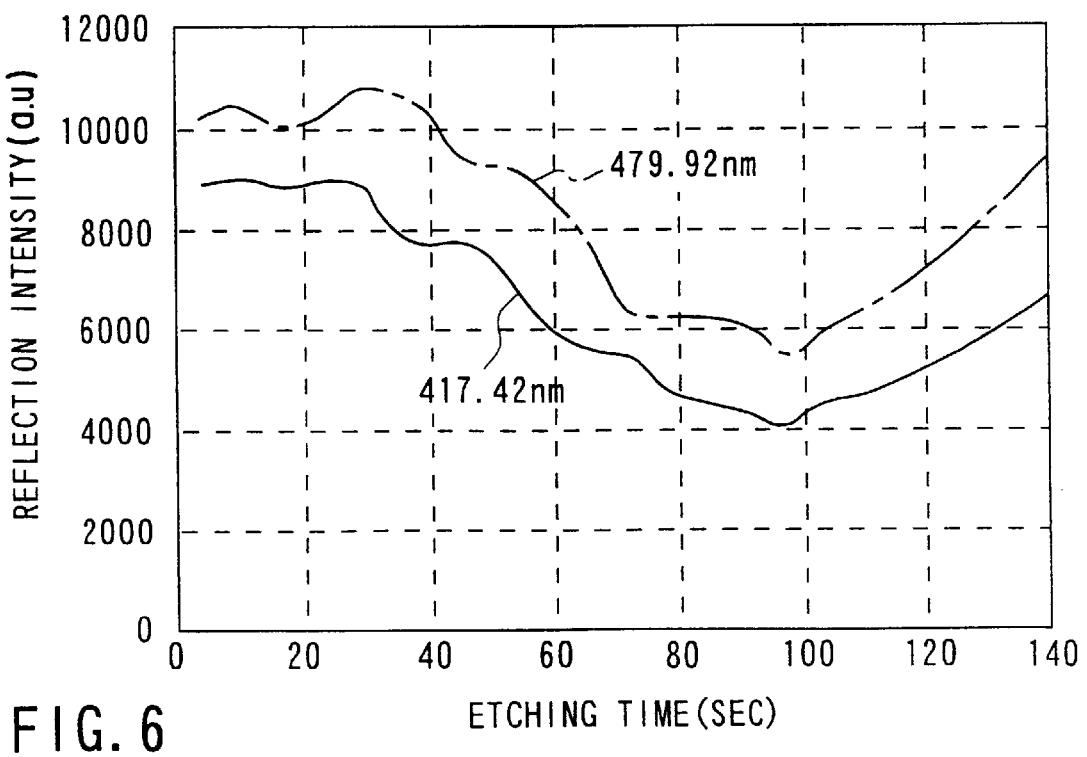
FIG. 6 is a graph corresponding to FIG. 3 and illustrating the waveforms of two types of reflected light influenced by light reflected from a resist layer.
Figure 7:
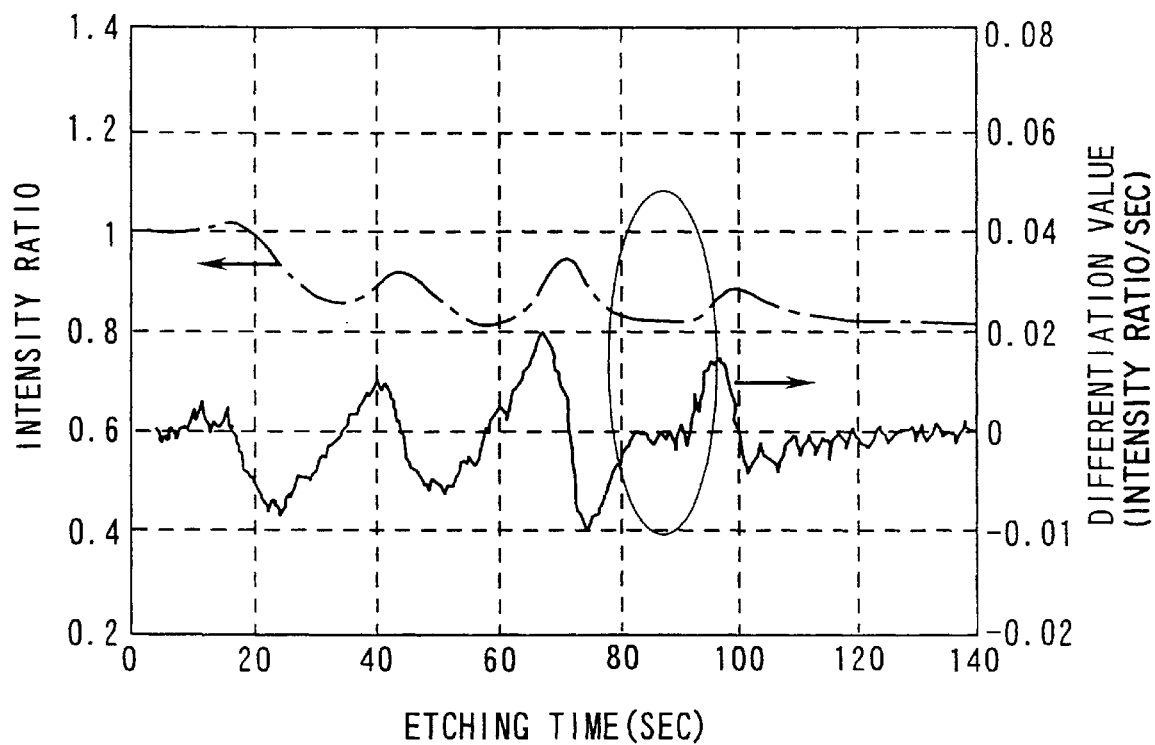
FIG. 7 is a graph corresponding to FIG. 5 and illustrating the relationship between the etching period and the intensity ratio of the two types of reflected light shown in FIG. 6 and the differentiation value of the intensity ratio.

When etching the above-described polysilicon layer P, the resist layer R is also etched. Therefore, it is possible that reflected light for detecting the termination time point will be influenced by light reflected from the resist layer R. However, since the rate of etching the resist layer R is lower than that of etching the polysilicon layer P, the intensity of light reflected from the resist layer R varies at a lower frequency than the polysilicon layer P. In light of this, when detecting the approximate termination time point using two types of reflected light components as described above, two types of reflected light components from the resist layer R, that have a close phase difference and relatively low frequencies (, for example, lower than half frequency of the interference wave of light reflected from the polysilicon layer P) as a result of interference are used to cancel the influence of the low-frequency drift wave of the resist layer R. If, for example, the interference waves of reflected light components with wavelengths of 417.42 nm and 479.92 nm are subjected to spectroscopic analysis using the polychromator 22, waveforms as shown in FIG. 6 are obtained. As is evident from the figure, each interference light component greatly rolls due to the influence of the resist layer R, and variations in the intensity of each interference light component are seen in its roll. In this state, the phase difference between the interference light components is hard to detect. Therefore, in this case, the intensity ratio of the interference light components or the differentiation value of the intensity ratio is calculated, whereby clear waveforms as shown in FIG. 7 are obtained. From the waveforms shown in FIG. 7, the approximate termination time point concerning the intensity ratio or concerning the differentiation value of the intensity ratio can be detected as in the above-described case. In FIG. 7, any time point included in the encircled portion can be set as the approximate termination time point.

In this embodiment, white light (including two or more light components of different wavelengths) is applied to the polysilicon layer P of a wafer W. Then, the waveforms (resulting from interference) of two types of reflected light components, which have wavelengths of, for example, 450 nm and 500 nm and are included in light components reflected from the surface of the polysilicon layer P and the boundary of the layer P and the gate oxide film O, are detected. After that, a time point, at which the intensity ratio of the two types of reflected light components approaches a constant value, or the differentiation value of the intensity ratio approaches 0, is determined as the approximate etching termination time point. This structure can provide the same advantage as obtained from the first-mentioned embodiment.

Although each of the above-described embodiments is directed to the etching of the polysilicon layer P provided on the gate oxide film O, the invention is also applicable to another type of a to-be-processed layer and its underlayer. Further, although the above embodiments use white light including a plurality of light components of different wavelengths, and hence use a single light source to detect the etching termination time point, the termination detecting method of the invention is also applicable to the case of using a single light source for emitting light, other than white light, which has a plurality of light components of different wavelengths, or applicable to the case of using a plurality of light sources for outputting respective wavelengths. The optical system interposed between the termination detecting unit and a to-be-processed object can be simplified in structure by perpendicularly applying light to the object. However, perpendicular application of light is not an essential constituent. In the method of the invention, it is sufficient if at least two types of light components of different wavelengths are applied to a to-be-processed layer, thereby detecting the waveforms, resulting from interference, of two types of reflected light components, which have different wavelengths and are included in light components reflected from the surface of the to-be-processed layer and the boundary of this layer and its underlayer, and then detecting an approximate etching termination time point based on the phase difference between the detected waveforms and used for stopping etching. The underlayer used in this invention includes a film and a substrate. The invention is also applicable to the etching of a to-be-processed layer if it is directly formed on a substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of detecting an etching termination time point at which a to-be-processed layer formed on an underlayer is etched using plasma, comprising:

applying at the same time, to the to-be-processed layer, at least two types of light components of different wavelengths during plasma etching, thereby causing light to reflect from a surface of the to-be-processed layer and from a boundary between the to-be-processed layer and the underlayer;

detecting waveforms of at least two reflected light components of different wavelengths and included in the reflected light, which result from interference; and detecting an approximate etching termination time point on the basis of a phase difference between the detected waveforms.

2. The method according to claim 1, wherein the phase difference is obtained from an intensity ratio between the detected waveforms.

3. The method according to claim 1, wherein the phase difference is obtained from a differentiation value of an intensity ratio between the detected waveforms.

4. The method according to claim 1, wherein, after the approximate etching termination time point is detected, an etching mode is switched from a low selective ratio mode to a high selective ratio mode.

5. The method according to claim 1, wherein the underlayer includes a gate oxide film, and the to-be-processed layer includes a polysilicon layer for a gate electrode.

6. The method according to claim 1, wherein light is perpendicularly applied to the to-be-processed layer.

7. The method according to claim 1, wherein detecting the approximate etching termination time point on the basis of the phase difference has the step of determining, as the approximate etching termination time point, a time point immediately before the phase difference becomes 0.

8. An etching termination time point detecting method comprising:

applying, to a to-be-processed dummy layer, light having a plurality of wavelengths, thereby causing light to reflect from a surface of the to-be processed dummy layer and from a boundary between the to-be-processed dummy layer and an underlayer;

detecting waveforms of at least two reflected light components of different wavelengths and included in the reflected light, which result from interference;

detecting, as an approximate etching termination time point, a time point at which a phase difference between the detected waveforms becomes 0;

setting a threshold value for detecting the approximate etching termination time point;

applying the light having the plurality of wavelengths to a to-be-processed layer included in a to-be-processed object, thereby causing light to reflect from the surface of the to-be-processed layer and from the boundary between the to-be-processed layer and an underlayer;

detecting waveforms of at least two reflected light components of different wavelengths and included in the reflected light from the to-be processed layer, which result from interference; and sequentially calculating a phase difference between the detected waveforms, then comparing the calculation result with the threshold value, and determining the approximate etching termination time point of the to-be-processed object.

9. An etching termination time point detecting method comprising:

etching, using plasma, a to-be-processed layer on an underlayer in a low selective ratio mode in which a ratio of a rate of etching the to-be-processed layer to a rate of etching the underlayer is low;

applying at the same time, to the to-be-processed layer, at least two types of light components of different wavelengths during plasma etching, thereby causing light to reflect from a surface of the to-be-processed layer and from a boundary between the to-be-processed layer and the underlayer;

detecting waveforms of at least two reflected light components of different wavelengths and included in the reflected light, which result from interference;

detecting an approximate etching termination time point on the basis of a phase difference between the detected waveforms; and switching, upon detecting the approximate etching termination time point, the low selective ratio mode to a high selective ratio mode, thereby etching a remaining portion of the to-be-processed layer.

* * * * *